(12) United States Patent
Dai et al.

(10) Patent No.: US 10,077,188 B2
(45) Date of Patent: Sep. 18, 2018

(54) MANUFACTURING METHOD OF MEMS CHIP

(71) Applicant: CSMC TECHNOLOGIES FAB1 CO., LTD., Jiangsu (CN)

(72) Inventors: Dan Dai, Jiangsu (CN); Xinwei Zhang, Jiangsu (CN); Guoping Zhou, Jiangsu (CN); Changfeng Xia, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 15/405,603

(22) Filed: Jan. 13, 2017

(65) Prior Publication Data

US 2017/0121175 A1    May 4, 2017

Related U.S. Application Data

(62) Division of application No. 14/411,537, filed as application No. PCT/CN2013/078523 on Jun. 29, 2013, now Pat. No. 9,580,301.

(30) Foreign Application Priority Data

Jul. 6, 2012    (CN) .......................... 2012 1 0234964

(51) Int. Cl.
     *B81C 1/00*          (2006.01)

(52) U.S. Cl.
     CPC .. *B81C 1/00825* (2013.01); *B81C 2201/0167* (2013.01); *B81C 2201/053* (2013.01)

(58) Field of Classification Search
     CPC .. B81C 1/00825; B81C 1/0038; B81C 7/0029
     See application file for complete search history.

(56) References Cited

U.S. PATENT DOCUMENTS

| | | | |
|---|---|---|---|
| 5,296,385 A | 3/1994 | Moslehi et al. | |
| 5,985,771 A | 11/1999 | Moore et al. | |
| 6,670,283 B2 | 12/2003 | Baker et al. | |
| 6,808,952 B1 | 10/2004 | Sniegowski et al. | |
| 6,967,757 B1 | 11/2005 | Allen et al. | |
| 7,208,021 B1* | 4/2007 | Vardosanidze | B81C 1/0038 257/E21.088 |
| 8,802,477 B2 | 8/2014 | Bedell et al. | |

(Continued)

FOREIGN PATENT DOCUMENTS

| CN | 101552271 A | 10/2009 |
|---|---|---|
| CN | 101887848 A | 11/2010 |

(Continued)

OTHER PUBLICATIONS

Office Action dated Mar. 8, 2017 issued in the corresponding Japanese Patent Application No. 2015-518815.

(Continued)

*Primary Examiner* — Nathan W Ha
(74) *Attorney, Agent, or Firm* — Polsinelli PC

(57) ABSTRACT

A method of manufacturing a MEMS chip includes: providing a silicon substrate layer, the silicon substrate layer comprising a front surface configured to perform a MEMS process and a rear surface opposite to the front surface; growing a first oxidation layer mainly made of $SiO_2$ on the rear surface of the silicon substrate layer by performing a thermal oxidation process; and depositing a first thin film layer mainly made of silicon nitride on the first oxidation layer by performing a low pressure chemical vapor deposition process.

4 Claims, 2 Drawing Sheets

(56) References Cited

U.S. PATENT DOCUMENTS

| | | | |
|---|---|---|---|
| 2002/0171080 A1* | 11/2002 | Faris | B81C 1/0038 257/40 |
| 2003/0168659 A1 | 9/2003 | Lal et al. | |
| 2004/0263944 A1* | 12/2004 | Miles | B81C 1/00182 359/290 |
| 2008/0050886 A1 | 2/2008 | Hirota | |
| 2009/0320274 A1* | 12/2009 | Kato | B81C 1/0038 29/596 |
| 2010/0052112 A1* | 3/2010 | Rogers | B81B 7/0093 257/625 |
| 2012/0098074 A1* | 4/2012 | Lin | B81C 1/00333 257/414 |

FOREIGN PATENT DOCUMENTS

| | | |
|---|---|---|
| GB | 2 369 490 A | 5/2002 |
| JP | 4-28887 | 1/1992 |
| JP | 2003-17711 A | 1/2003 |
| WO | 2011/051078 A1 | 5/2011 |

OTHER PUBLICATIONS

Office Action dated Nov. 4, 2015 issued in Chinese Application No. 201210234964.3.
Supplementary European Search Report dated Dec. 8, 2015 issued in European Application No. 13813814.4.
Liu, Chang. Foundations of MEMS, Second Edition, 2012, pp. 16-52.
Office Action dated Apr. 28, 2015 issued in Chinese Application No. 201210234964.3.

\* cited by examiner

MANUFACTURING METHOD OF MEMS CHIP

CROSS REFERENCE TO RELATED APPLICATIONS

This application is a divisional application and claims priority to U.S. application Ser. No. 14/411,537 filed Dec. 29, 2014, the contents of which are incorporated herein by reference in its entirely.

FIELD OF THE INVENTION

The present invention relates to semiconductor technologies, and more particularly relates to a manufacturing method of a MEMS chip.

BACKGROUND OF THE INVENTION

Micro-Electro-Mechanical System (MEMS) is a micro device or system integrated with a micro mechanism, a micro sensor, a micro actuator, a signal processing and controlling unit, an interface, communication, and a power supply, and which is operable to be batch produced. MEMS is developed with the development of micro fabrication and ultra precision machining of the semiconductor integrated circuit. Currently, a MEMS fabricating technique is widely used in a field of microfluidic chips and synthetic biology, thus the biochemistry laboratory techniques can be developed in the form of integrated chips.

In a conventional manufacturing process of the MEMS, the chip with a thickness less than 400 micrometers is often used. The chip is double sides polished, a MEMS process is performed on the front surface. As the chip is double sides polished, and it is very thin, the rear surface is easy to be scratched during the micro-electromechanical process, which will affect a subsequent processing.

SUMMARY OF THE INVENTION

Accordingly, it is necessary to provide a manufacturing method of MEMS chip, in which a rear surface of the manufactured MEMS chip is effectively protected from the scratch damage.

A method of manufacturing a MEMS chip includes:

providing a silicon substrate layer, the silicon substrate layer comprising a front surface configured to perform a MEMS process and a rear surface opposite to the front surface;

growing a first oxidation layer mainly made of $SiO_2$ on the rear surface of the silicon substrate layer by performing a thermal oxidation process;

depositing a first thin film layer mainly made of silicon nitride on the first oxidation layer by performing a low pressure chemical vapor deposition process.

According to one embodiment, the method further includes:

growing a second oxidation layer mainly made of $SiO_2$ on the front surface of the silicon substrate layer by performing a thermal oxidation process.

According to one embodiment, a ratio of a thickness of the first oxidation layer to a thickness of the first thin film layer ranges from 3 to 4.

According to one embodiment, the thickness of the first oxidation layer is 400 nm, the thickness of the first thin film layer is 100 nm, a thickness of the second oxidation layer is 100 nm.

According to one embodiment, the method further includes:

depositing a second thin film layer mainly made of silicon nitride on the second oxidation layer by performing a low pressure chemical vapor deposition process, the second oxidation layer has the same thickness as that of the first oxidation layer, the second thin film layer has the same thickness as that of the first thin film layer.

In the above MEMS chip and the manufacturing method of the MEMS chip, the first oxidation layer and the first thin film layer are formed on the rear surface of the silicon substrate layer, thus the rear surface is protected to prevent scratch damage in the micro-electromechanical processes.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
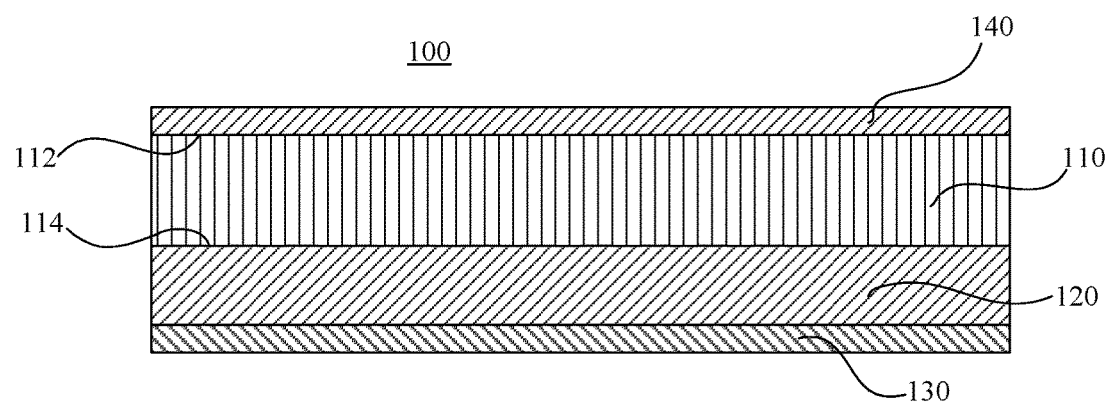
FIG. 1 is a schematic view of a MEMS chip according to one embodiment.

Referring to FIG. 1, an embodiment of a MEMS chip 100 includes a silicon substrate layer 110, a first oxidation layer 120, and a first thin film layer 130, which are sequentially laminated.

The silicon substrate layer 110 has very small thickness, which is about 400 micrometers. The silicon substrate layer 110 is made of high purity silicon and includes a front surface 112 and a rear surface 114. The front surface 112 and the rear surface 114 are polished surfaces. A MEMS process, such as lithography, etching etc. is performed on the front surface 112. The rear surface 114 is easy to be scratched in performing related processes.

The first oxidation layer 120 is mainly made of silicon dioxide ($SiO_2$) and formed on the rear surface 114 of the silicon substrate layer 110. The first thin film layer 130 is mainly made of silicon nitride ($Si_3N_4$) and formed on a surface of the first oxidation layer 120. The silicon substrate layer 110, the first oxidation layer 120, and the first thin film layer 130 are sequentially laminated.

In the above MEMS chip 100, the first oxidation layer 120 and the first thin film layer 130 are formed on the rear surface 114 of the silicon substrate layer 110, thus the rear surface 114 is protected and cannot be scratched in performing Micro-electromechanical processes.

It is to be noted that, the first thin film layer 130 mainly made of silicon nitride is mainly used to protect the rear surface 114 of the silicon substrate layer 110. There is a combined stress between the first thin film layer 130 and the first oxidation layer 120, as the silicon substrate layer 110 is too thin, the combined stress will cause the MEMS chip 100 to warp, the MEMS chip 100 will be severely deformed and the normal use of the MEMS chip 100 will be affected.

In order to reduce the affection of the MEMS chip 100 caused by the combined stress, referring to FIG. 1 again, the MEMS chip 100 further includes a second oxidation layer 140 which is made of the same material as that of the first oxidation layer 120. Both of the second oxidation layer 140 and the first oxidation layer 120 are made of $SiO_2$. The second oxidation layer 140 is formed on the front surface 112 of the silicon substrate layer 110.

A ratio of the thickness of the first oxidation layer 120 to that of the first thin film layer 130 ranges from 3 to 4. In the illustrated embodiment, the thickness of the first oxidation layer 120 is 400 nm, the thickness of the first thin film layer 130 is 100 nm, the thickness of the second oxidation layer 140 is 100 nm.

By setting the thickness of the first oxidation layer 120, the second oxidation layer 140, and the first thin film layer 130 in a reasonable range, the combined stress between the first thin film layer 130 and the first oxidation layer 120 can be compensated by the second oxidation layer 140, thus the MEMS chip is prevented from warping.

Figure 2:
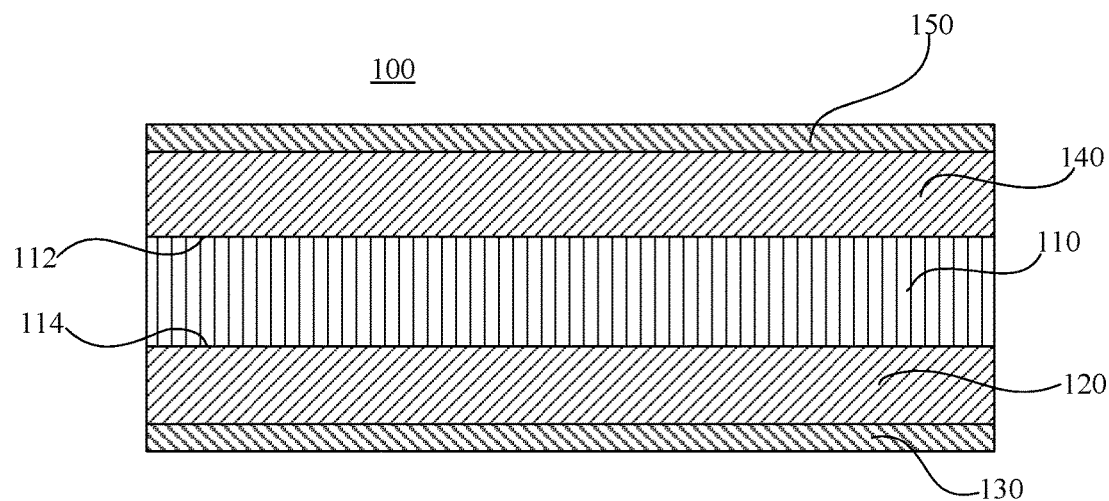
FIG. 2 is a schematic view of a MEMS chip according to another embodiment.

In another embodiment, referring to FIG. 2, the MEMS chip 100 further includes a second thin film layer 150. The second thin film layer 150 is made of the same material as that of the first thin film layer 130, both of them are made of silicon nitride. The second thin film layer 150 is formed on a surface of the second oxidation layer 140.

The second oxidation layer 140 has the same thickness as the first oxidation layer 120, the second thin film layer 150 has the same thickness as the first thin film layer 130. Combined stresses exerted on the front surface 112 and the rear surface 114 of the silicon substrate layer are the same, and they can be compensated, the MEMS chip 100 is prevented from warping.

Figure 3:
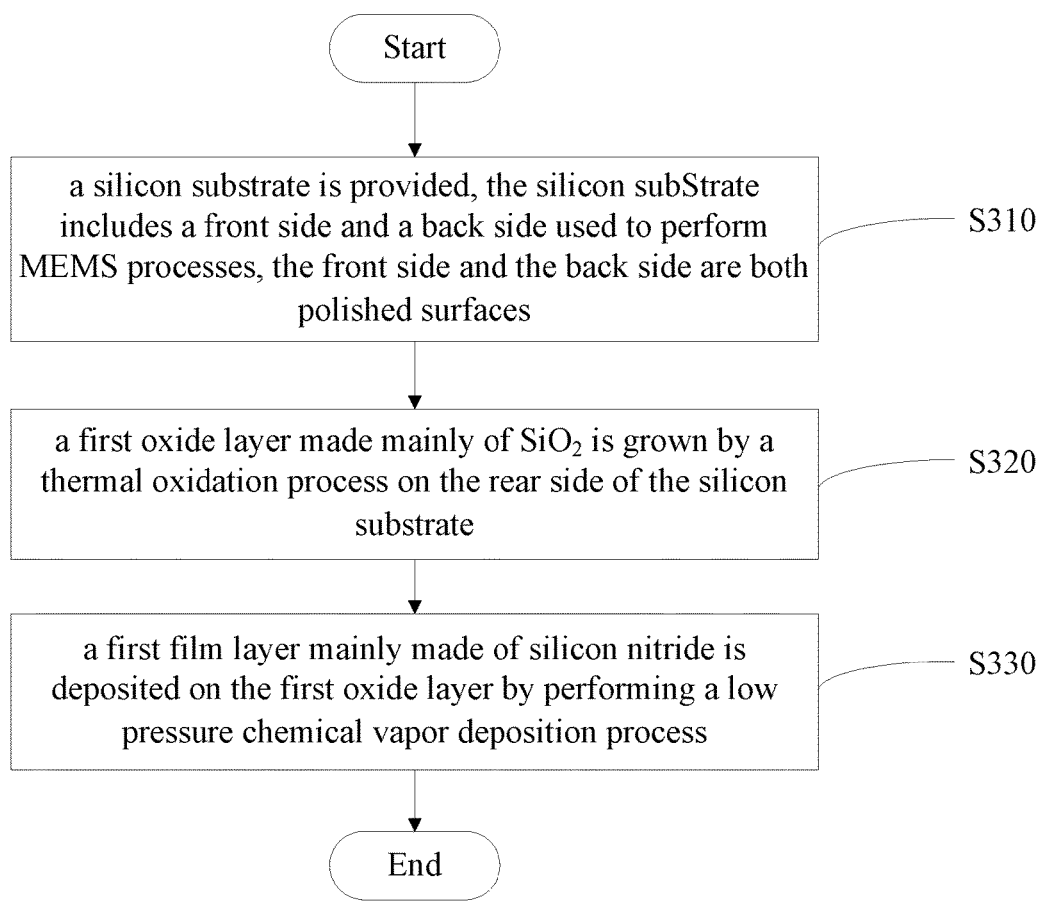
FIG. 3 is a flow chart of a manufacturing method of the MEMS chip according to one embodiment.

Referring to FIG. 3, an embodiment of a method of manufacturing the MEMS 100 includes the following steps.

Step S310, a silicon substrate layer is provided, the silicon substrate layer includes a front surface and a rear surface used to perform Micro-electromechanical processes, the front surface and the rear surface are both polished surfaces. Referring to FIG. 1 again, the silicon substrate layer 110 is provided, the silicon substrate layer 110 is very thin and it is about 400 micrometers. The silicon substrate layer 110 is made of high purity silicon and includes a front surface 112 and a rear surface 114 which are opposite to each other. The front surface 112 and the rear surface 114 are both polished surfaces, Micro-electromechanical processes such as lithography, etching can be performed on the front surface 112.

Step S320, a first oxidation layer made mainly of $SiO_2$ is grown by a thermal oxidation process on the rear surface of the silicon substrate layer. The thermal oxidation process includes dry oxidation and wet oxidation. In a specific embodiment, the first oxidation layer 120 mainly made of $SiO_2$ is grown on the silicon substrate layer 110 by a wet oxidation process, a heating temperature is about 1000° C., finally the first oxidation layer 120 is formed on the rear surface 114 of the silicon substrate layer 110.

Step S330, a first thin film layer mainly made of silicon nitride is deposited on the first oxidation layer by performing a low pressure chemical vapor deposition process. The first thin film layer 130 mainly made of silicon nitride is deposited on the first oxidation layer 120 by performing a low pressure chemical vapor deposition process. Finally the silicon substrate layer 110, the first oxidation layer 120, and the first thin film layer 130 are sequentially laminated.

In the above method of manufacturing the MEMS chip, the first oxidation layer 120 and the first thin film layer 130 which are sequentially laminated are formed on the rear surface 114 of the silicon substrate layer 110, which protect the rear surface 114 of the silicon substrate layer from scratching when performing the Micro-electromechanical process.

It is to be noted that, in the MEMS chip 100, the first thin film layer 130 is mainly used to protect the rear surface 114 of the silicon substrate layer 110. There is a combined stress between the first thin film layer 130 and the first oxidation layer 120, as the silicon substrate layer 110 is too thin, the combined stress may cause the MEMS chip to warp. Thus the MEMS chip 100 is severely deformed and cannot be used.

In order to reduce the affection of the MEMS chip 100 caused by the combined stress, the method of manufacturing the MEMS chip further includes a step of growing a second oxidation layer mainly made of SiO2 on the front surface of the silicon substrate layer by performing a thermal oxidation process. The second oxidation layer 140 is made of the same material as that of the first oxidation layer 120.

A ratio of the thickness of the first oxidation layer 120 to that of the first thin film layer 130 formed in the above method ranges from 3 to 4. In a specific embodiment, the thickness of the first oxidation layer 120 is 400 nm, the thickness of the first thin film layer 130 is 100 nm, the thickness of the second oxidation layer 140 is 100 nm.

By setting the thickness of the first oxidation layer 120, the second oxidation layer 140, and the first thin film layer 130 in a reasonable range, the combined stress between the first thin film layer 130 and the first oxidation layer 120 can be compensated by the second oxidation layer 140, thus the MEMS chip 100 is protected from warping.

In another embodiment, the method of manufacturing the MEMS chip further includes a step of depositing a second thin film layer mainly made of silicon nitride on the second oxidation layer by performing a low pressure chemical vapor deposition process, the thickness of the second oxidation layer is the same as the thickness of the first oxidation layer, the thickness of the second thin film layer is the same as the thickness of the first thin film layer. Referring to FIG. 2 again, the second thin film layer 150 is deposited on the second oxidation layer 140 by performing a low pressure chemical vapor depositing process, the second thin film layer 150 is made of the same material as that of the first thin film layer 130, both of them are made of silicon nitride. The second thin film layer 150 is formed on the surface of the second oxidation layer 140.

The second oxidation layer 140 has the same thickness as that of the first oxidation layer 120, the second thin film layer 150 has the same thickness as that of the first thin film layer 130. Thus the combined stresses on the front surface 112 and the rear surface 114 of the silicon substrate layer 110 are the same and can be compensated with each other, the MEMS can be prevented from warping.

It is to be noted that, in the practical manufacturing process, when performing a thermal oxidation process to the silicon substrate layer 110, the first oxidation layer 120 and the second oxidation layer 140 are formed on the front surface 112 and the rear surface 114 of the silicon substrate layer 110 by synchronously performing wet oxidation processes and pipe furnace process. In addition, the first thin film layer 130 and the second thin film layer 150 can also be deposited synchronously.

When a subsequent MEMS process is performed to the MEMS chip 100, the second oxidation layer 140 and the second thin film layer 150 can be removed, a related process will be performed on the front surface 112 of the silicon substrate layer 110, the combined stresses on the front surface 112 and the rear surface 114 of the silicon substrate layer 110 are not balanced. An oxidation layer made of $SiO_2$ can be grown again on the front surface 112 of the silicon substrate layer 110, the combined stress between the first oxidation layer 120 and the first thin film layer 130 can be balanced by adjusting the thickness of the oxidation layer made of $SiO_2$, thus the MEMS chip 100 is prevented from warping.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a MEMS chip, comprising:
   providing a silicon substrate layer, the silicon substrate layer comprising a front surface for a MEMS process and a rear surface opposite to the front surface;
   growing a first oxidation layer mainly made of $SiO_2$ on the rear surface of the silicon substrate layer by performing a thermal oxidation process;
   depositing a first thin film layer mainly made of silicon nitride on the first oxidation layer by performing a low pressure chemical vapor deposition process;
   growing a second oxidation layer mainly made of $SiO_2$ on the front surface of the silicon substrate layer by performing a thermal oxidation process;
   wherein a ratio of a thickness of the first oxidation layer to a thickness of the first thin film layer ranges from 3 to 4.

2. The method according to claim 1, wherein the thickness of the first oxidation layer is 400 nm, the thickness of the first thin film layer is 100 nm, a thickness of the second oxidation layer is 100 nm.

3. The method according to claim 1, further comprising:
   depositing a second thin film layer mainly made of silicon nitride on the second oxidation layer by performing a low pressure chemical vapor deposition process, wherein the second oxidation layer has the same thickness as that of the first oxidation layer, the second thin film layer has the same thickness as that of the first thin film layer.

4. The method of claim 1, wherein the silicon substrate layer is high purity silicon.

* * * * *